(12) United States Patent
Lee (10) Patent No.: US 7,442,473 B2
(45) Date of Patent: Oct. 28, 2008

(54) METHOD FOR FORMING MASK PATTERN OF SEMICONDUCTOR DEVICE

(75) Inventor: Jun Seok Lee, Goyang (KR)

(73) Assignee: Dongbu Electronics Co., Ltd., Seoul (KR)

(*) Notice: Subject to any disclaimer, the term of this patent is extended or adjusted under 35 U.S.C. 154(b) by 642 days.

(21) Appl. No.: 11/023,307

(22) Filed: Dec. 27, 2004

(65) Prior Publication Data

US 2005/0186484 A1 Aug. 25, 2005

(30) Foreign Application Priority Data

Dec. 27, 2003 (KR) .................. 10-2003-0098323

(51) Int. Cl.
*G03F 1/00* (2006.01)
(52) U.S. Cl. ........................................................ 430/5
(58) Field of Classification Search ................ 430/5, 430/394; 716/19–21
See application file for complete search history.

(56) References Cited

U.S. PATENT DOCUMENTS 6,703,167 B2 * 3/2004 LaCour .......................... 430/5
2004/0023132 A1 * 2/2004 Akiyama ....................... 430/5

FOREIGN PATENT DOCUMENTS

| KR | 100172561 | 10/1998 |
| KR | 10-1999-0066046 | 8/1999 |
| KR | 10-2003-0056499 | 12/2001 |

* cited by examiner

*Primary Examiner*—Stephen Rosasco
(74) *Attorney, Agent, or Firm*—Andrew D. Fortney (57) ABSTRACT

A method for forming a mask pattern of a semiconductor device is disclosed. An example method arranges a main pattern and arranges a first fine auxiliary pattern in the vicinity of the main pattern. The example method also arranges a second fine auxiliary pattern in the vicinity of edges of the main pattern. In the example method, the second fine auxiliary pattern has a predetermined tilt angle with respect to the first fine auxiliary pattern.

3 Claims, 8 Drawing Sheets

FIG. 1A
(Background)

FIG. 1B
(Background)

FIG. 2A
(Background)

FIG. 2B
(Background)

FIG. 2C
(Background)

FIG. 3A
(Background)

FIG. 3B
(Background)

FIG. 3C
(Background)

METHOD FOR FORMING MASK PATTERN OF SEMICONDUCTOR DEVICE

TECHNICAL FIELD

The present disclosure relates to a method for forming a mask pattern of a semiconductor device and, more particularly, to a method that enhances resolution of a mask pattern by correcting line width patterning using an auxiliary pattern when a mask of a semiconductor transistor is formed.

BACKGROUND

In general, a mask pattern formation technique employed in fabricating a semiconductor device has a significant effect on accuracy of a pattern formed on the semiconductor device. Particularly, if an optical proximity effect of a mask pattern is not properly considered, distortion of a pattern line width, such as shortening of linearity of the line width, occurs contrary to the original purpose of lithographic exposure, which results in deterioration of characteristics of the semiconductor device.

On the other hand, a semiconductor photolithography technique can properly adjust the amount of light passing through a mask by designing the mask elaborately. To this end, an optical proximity correction (OPC) technique and a phase shifting mask technique have been introduced and various methods for minimizing light distortion due to deformation of a mask pattern have been used.

Recently, with the development of chemically amplified resists, which are very sensitive to light having a far-ultraviolet wavelength of 248 nm or 194 nm, practical techniques for enhancing resolution have been introduced. Particularly, a technique for forming an auxiliary pattern, which is separated from a main pattern, such as a dummy pattern used to control an optical proximity effect, contributes to enhancement of resolution.

Figure 1A:
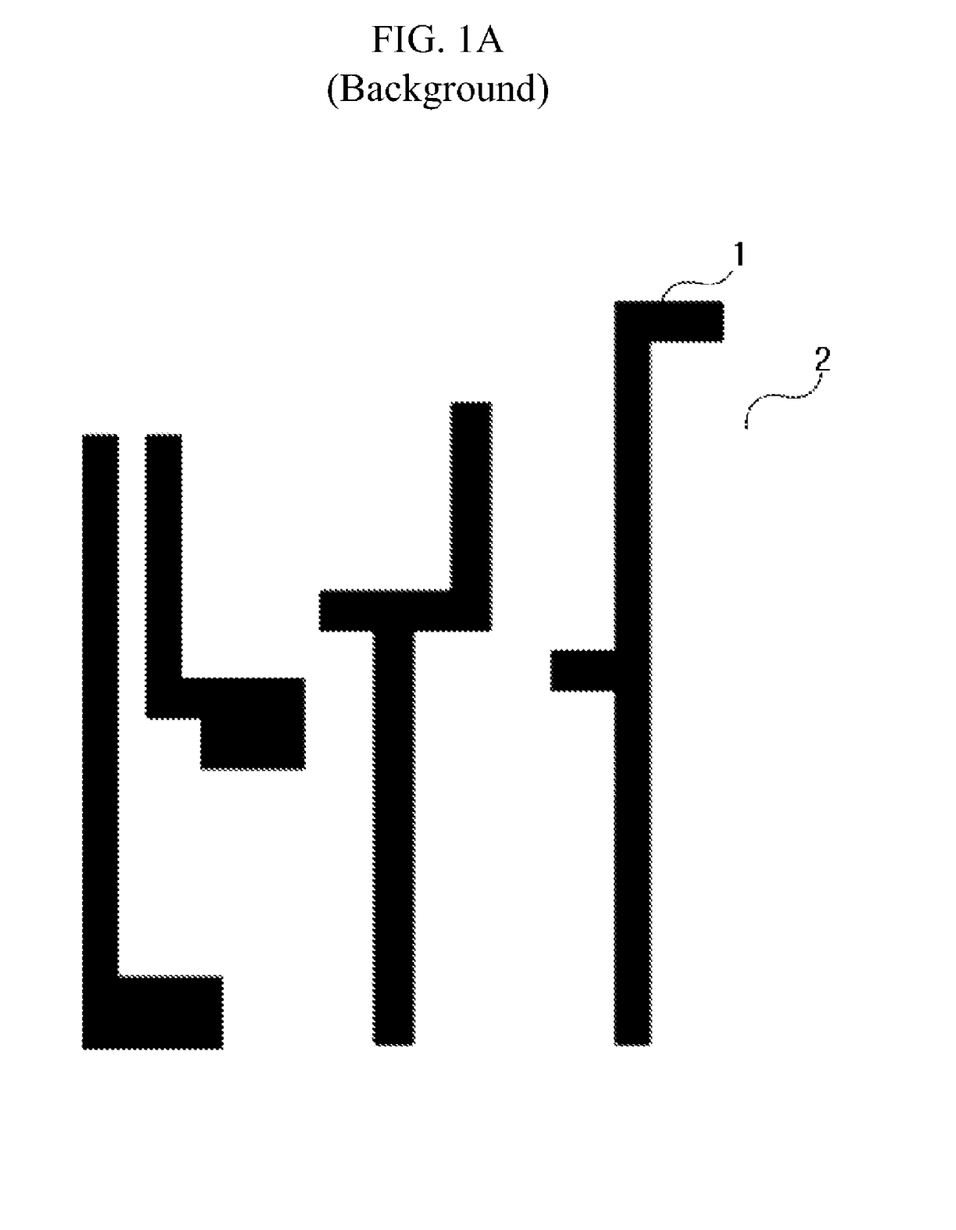
FIGS. 1a and 1b are diagrams showing the original of a semiconductor mask pattern and a mask pattern having fine auxiliary patterns and to which a known OPC technique for correcting an optical proximity effect is applied.
Figure 1B:
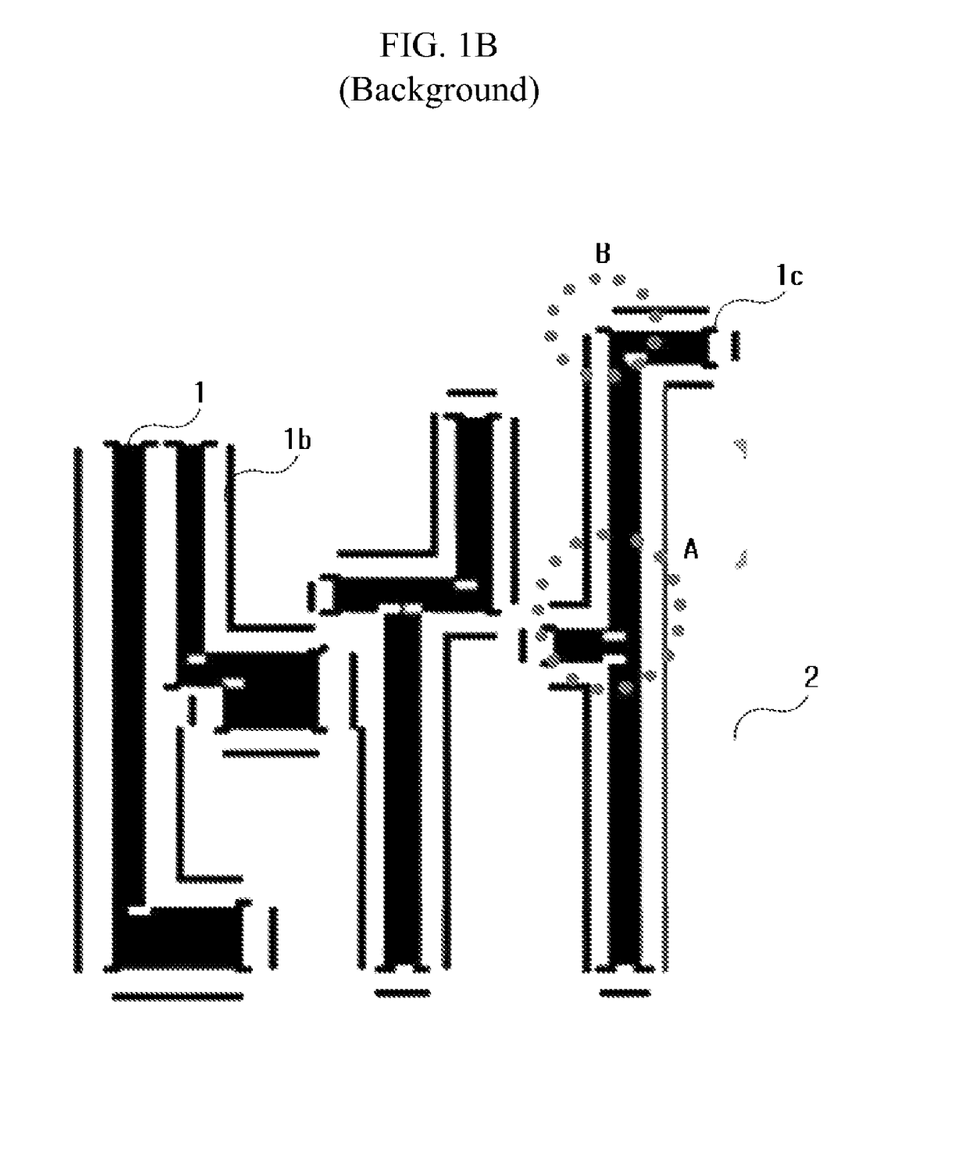

FIGS. 1a and 1b are diagrams showing the original of a semiconductor mask pattern and a mask pattern having a fine auxiliary pattern and to which the well-known OPC technique is applied. Referring to FIG. 1a, the conventional semiconductor mask pattern includes a gate pattern 1 as a main pattern of a logic device, which corresponds to a light shielding region. Other portions in the mask pattern correspond to a light transmitting region 2. FIG. 1b is a diagram showing an OPC pattern attached to the main pattern 1 to alleviate non-uniformity of light intensity distribution, and a fine auxiliary pattern 1c disposed in the vicinity of the main pattern. The fine auxiliary pattern 1c refers to a fine pattern having a line width less than a resolution limit. Although this fine auxiliary pattern 1c exists in the mask, it is not present on a semiconductor substrate after an exposure process is performed.

Resolution of the division patterns can be defined by a Rayleigh's equation as expressed by Equation 1.

$$R(\text{Resolution}) = k * \lambda / N.A. \quad \text{Equation 1}$$

Where, k is constant, λ is a wavelength of light emitted from an illuminometer, and N.A. is an aperture of an illuminating lens. For example, when k is 0.5, λ is 0.248, and N.A. is 0.65, resolution (R)=0.19 μm. Accordingly, when a fine pattern having a line width less than the value of the resolution is independently applied to a mask, a pattern for passing light through only the mask physically while an image is not formed in a photosensitive agent can be defined.

Referring again to FIG. 1b, the fine auxiliary pattern 1c has problems in resolution of edges of a pattern. Particularly, if the fine auxiliary pattern 1c contacts with another auxiliary pattern 1c at a certain angle, as indicated by reference letter A, or is not properly isolated therefrom, as indicated by reference letter B, there is a problem of pattern distortion on the semiconductor substrate.

Figure 2A:
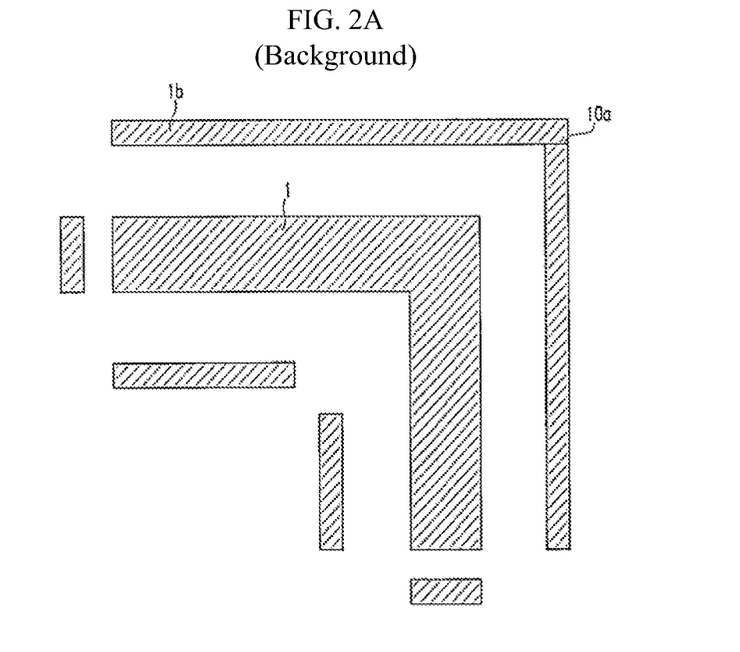
FIGS. 2a to 2c are diagrams depicting known mask pattern formation problems.
Figure 2B:
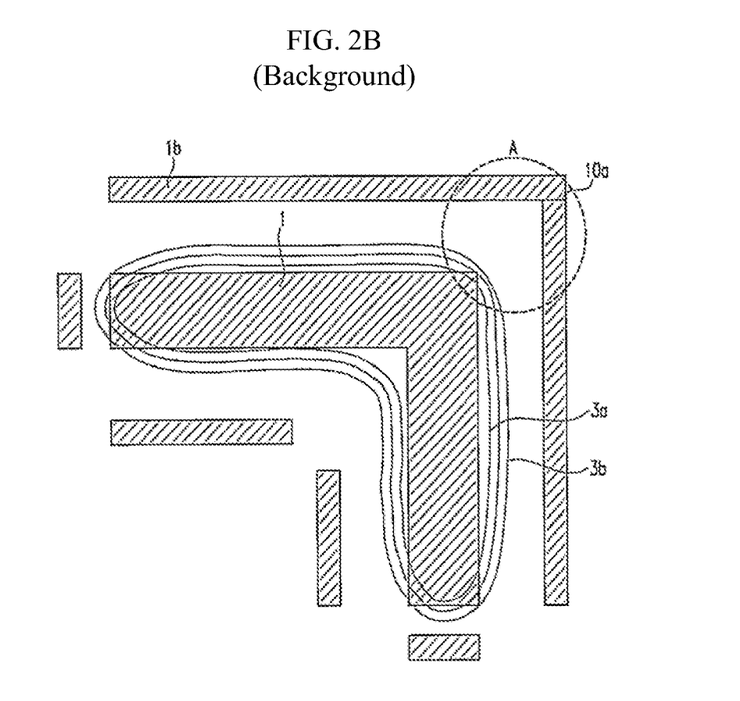
Figure 2C:
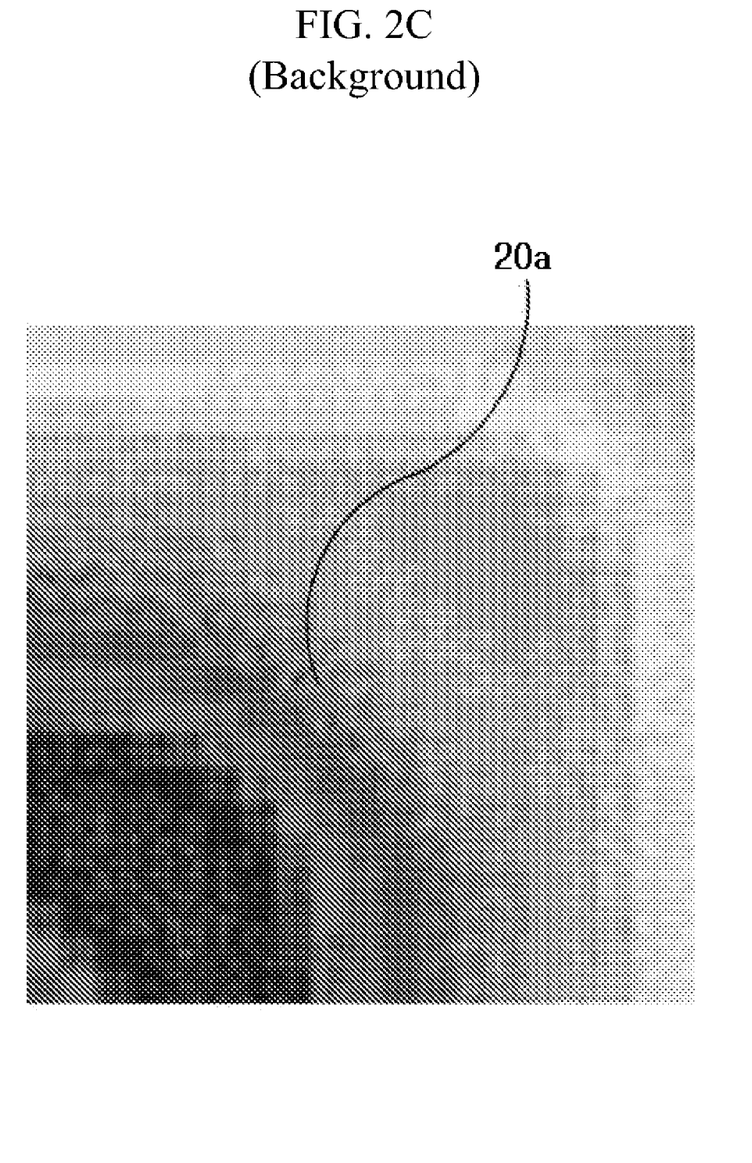

FIGS. 2a to 2c are diagrams that depict known mask pattern formation problems. FIG. 2a shows a mask including a plurality of fine auxiliary patterns, which are attached to each other. FIG. 2b shows overlapped contour images having a light intensity distribution depending on the amount of exposure energy of light passing through a mask, and FIG. 2c shows a continuous distribution of light intensity in the vicinity of edges of a main pattern with an angle of 90 degrees.

FIG. 2a shows an enlarged mask corresponding to the region A in FIG. 1b. As shown in FIG. 2a, a plurality of fine auxiliary patterns 1c are attached to each other, as indicated by reference numeral 10a, in the vicinity of edges (with an angle of 90 degrees) of a main pattern 1. The main purpose of arranging the fine auxiliary patterns is to enhance resolution. The fine auxiliary patterns must not be formed on a semiconductor substrate. However, because the intensity of light at a portion where the fine auxiliary patterns 1c are attached to each other is very low if lack of exposure is significant or an optical apparatus has an unstable focus depth, undesired traces of the auxiliary patterns appear on a resist pattern of the semiconductor substrate. These traces become contamination sources by particles when an etching process is performed. FIG. 2b shows overlapped contour images 3a and 3b having a light intensity distribution depending on amount of exposure energy of light passing through a mask. As shown in the figure, as an optimal exposure distribution 3a is changed to a lack of exposure distribution 3b, the distribution of light intensity in the vicinity of the edges (with an angle of 90 degrees) of the main pattern 1 is seriously distorted and the edges to be formed on the semiconductor are rounded.

FIG. 2c shows a continuous distribution of light intensity in the vicinity of edges of a main pattern with an angle of 90 degrees. In FIG. 2c, a region with a dark color represents a portion showing weak light intensity and a region with a light color represents a portion showing strong light intensity. Reference numeral 20a denotes a pattern formed by an optimal exposure. Here, the optimal exposure refers to energy conditions under which exposure apparatus emits light such that a pattern has the same line width as the original mask shown in FIG. 1a. FIG. 2c shows a distribution having a problem in that the edges are rounded.

Figure 3A:
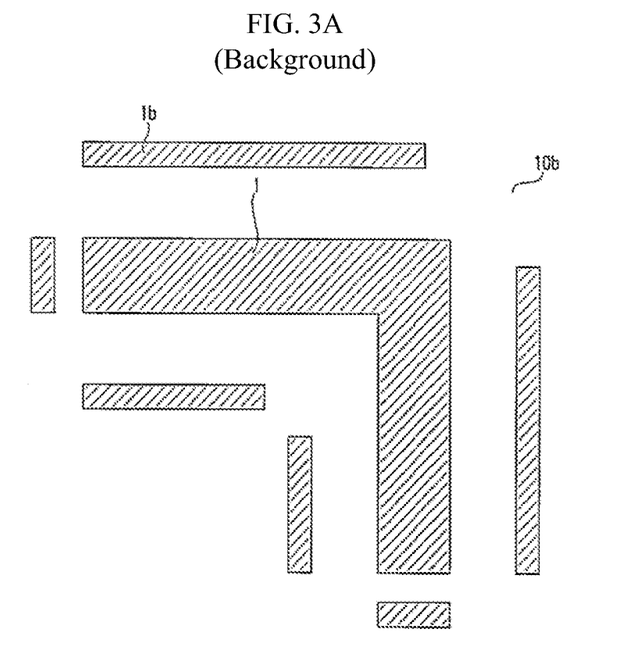
FIGS. 3a to 3c are diagrams depicting further known mask pattern formation problems.
Figure 3B:
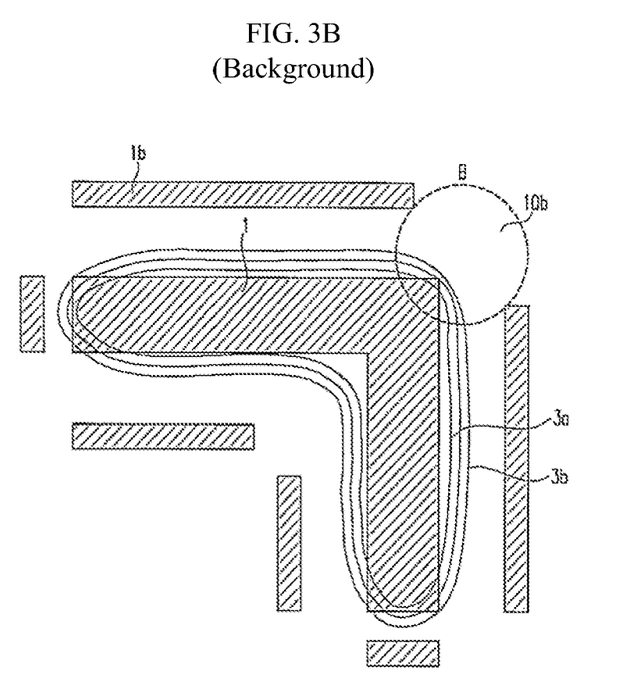
Figure 3C:
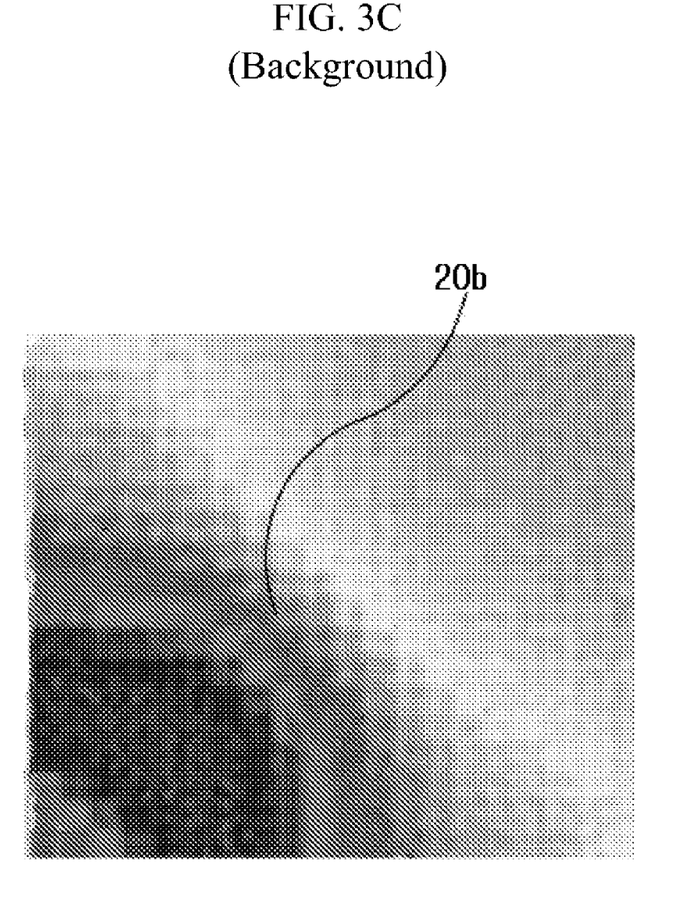

FIGS. 3a to 3c are diagrams for explaining problems when a mask pattern is formed in the prior art. In particular, FIG. 3a shows a mask including a plurality of fine auxiliary patterns, which are isolated from each other, FIG. 3b shows overlapped contour images having a light intensity distribution depending on the amount of exposure energy of light passing through a mask, and FIG. 3c shows a continuous distribution of light intensity in the vicinity of edges of a main pattern with an angle of 90 degrees.

FIG. 3a shows an enlarged mask including a plurality of fine auxiliary patterns 1c, which are isolated from each other. As shown in FIG. 3a, the plurality of fine auxiliary patterns 1c are isolated from each other, as indicated by reference numeral 10b, in the vicinity of edges (with an angle of 90 degree) of a main pattern 1. FIG. 3b shows overlapped contour images 3a and 3b having a light intensity distribution depending on amount of exposure energy of light passing through the mask. As shown in the figure, as an optimal exposure distribution 3a is changed to a lack of exposure distribution 3b, the distribution of light intensity in the vicinity of the edges (with an angle of 90 degree) of the main pattern 1 is seriously distorted and the edges to be formed on the semiconductor are rounded. Particularly, a pattern distortion at the edges with an angle of 90 degrees causes a more serious problem of a process margin for alignment of a contact hole mask, compared to a pattern distortion at the edges with an angle of 270 degrees.

FIG. 3c shows a continuous distribution of light intensity in the vicinity of edges of a main pattern with an angle of 90 degree. In the figure, reference numeral 20b denotes a pattern formed by an optimal exposure.

DETAILED DESCRIPTION

An example method for forming a mask pattern of a semiconductor device arranges a main pattern, a first fine auxiliary pattern in the vicinity of the main pattern, and a second fine auxiliary pattern in the vicinity of edges of the main pattern. The second fine auxiliary pattern has a certain tilt angle with respect to the first fine auxiliary pattern. Preferably, the tilt angle at which the second fine auxiliary pattern is arranged is 45 degrees, and the second fine auxiliary pattern is arranged such that an oblique side of an edge of the second fine auxiliary pattern is perpendicular to an edge of the first fine auxiliary pattern. Also, preferably, the second fine auxiliary pattern is isolated from the first fine auxiliary pattern, and the isolation distance between the first and second fine auxiliary patterns is more than 0.02 μm. Still further, at least two first fine auxiliary pattern and at least one second fine auxiliary pattern is preferably arranged separately for one main pattern, an oblique side of the second fine auxiliary pattern is perpendicular to the edge of the main pattern, respectively, and oblique sides of the first and second fine auxiliary patterns are perpendicular to an edge of the main pattern. Additionally, the first and second fine auxiliary patterns and the main pattern preferably do not contact one another. Preferably, the first and second fine auxiliary patterns are arranged in the outside of the main pattern when the edge of the main pattern has an angle of 45 to 135 degrees, and the first and second fine auxiliary patterns are arranged in the inside of the main pattern when the edge of the main pattern has an angle other than an angle of 45 to 135 degrees. Preferably, the first and second fine auxiliary patterns have a line width of 0.03 to 0.12 μm.

With the above example method, by selectively dividing the fine auxiliary patterns to have an angle of 45 degrees in the vicinity of the edge of the main pattern, a margin of the edge of the main pattern at which a contact hole is formed can be easily secured. In addition, because a plurality of fine auxiliary patterns and the main pattern formed in the vicinity of the edge of the main pattern do not contact one another, any malfunction, which may be caused by the fine auxiliary patterns, can be prevented, and resolution of the edge of the main pattern can be enhanced.

Figure 4A:
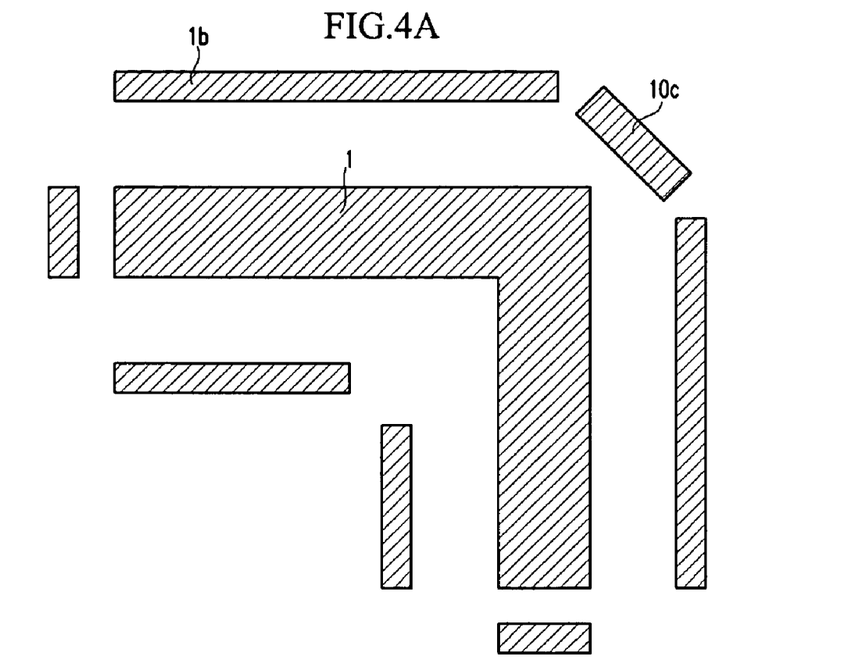
FIGS. 4a to 4c are diagrams illustrating an example method for forming a mask pattern of a semiconductor device.
Figure 4B:
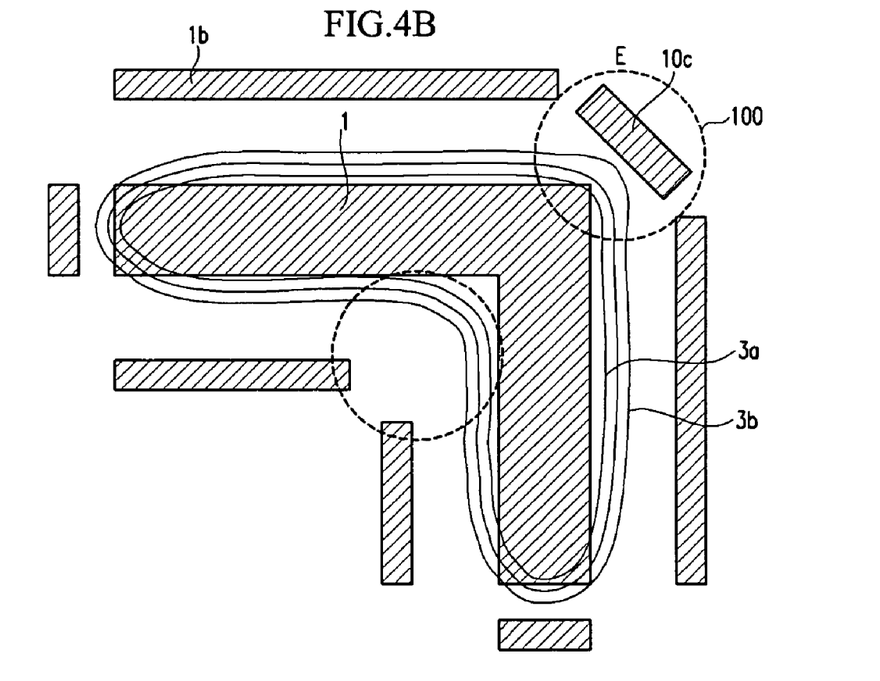
Figure 4C:
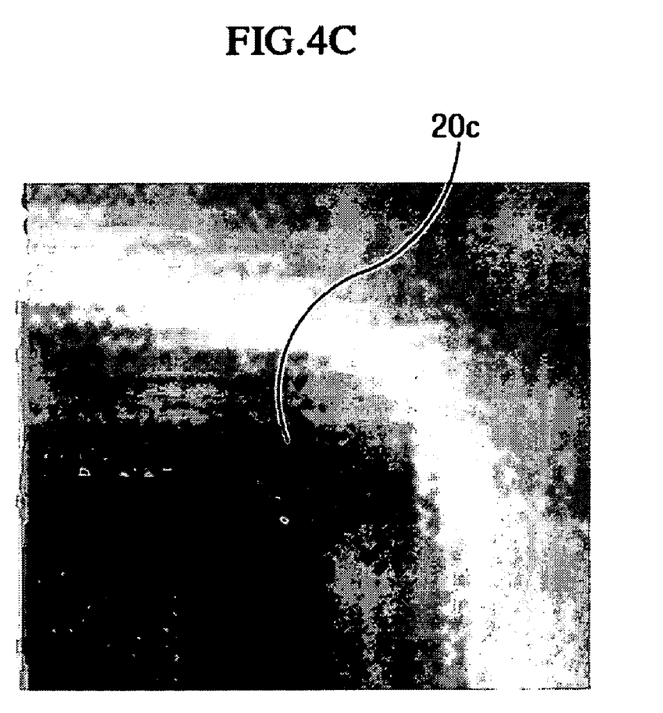

FIGS. 4a to 4c are diagrams illustrating an example method for forming a mask pattern of a semiconductor device. In general, this example method prevents a rounding error from occurring at an edge of a main pattern by using separate fine auxiliary patterns arranged at the edge of the main pattern.

Referring in detail to FIG. 4a, first, a main pattern 1 is arranged, a first fine auxiliary pattern 1b is arranged in the vicinity of the main pattern 1, and a second fine auxiliary pattern 10c is arranged in the vicinity of edge of the main pattern, such that the second fine auxiliary pattern 10c has a certain tilt angle with the first fine auxiliary pattern 1b. The first fine auxiliary pattern 1b having a line width of 0.08 μm is arranged in the vicinity of the main pattern 1 having a line width of 0.15 μm, and the second fine auxiliary pattern 10c is arranged in the vicinity of edge of the main pattern, such that an oblique side of an edge of the second fine auxiliary pattern 10c is perpendicular to the edge of the first fine auxiliary pattern, with a certain tilt angle of 45 degrees with the first fine auxiliary pattern 1b. In this case, the second fine auxiliary pattern 10c must be arranged to be isolated from the first fine auxiliary pattern 1b. At this time, the isolation distance between the first and second fine auxiliary pattern is more than 0.02 μm.

At this time, the first and second fine auxiliary patterns 1b and 10c are at least three for the main pattern 1, respectively, the oblique side of the first and second fine auxiliary patterns 1b and 10c are perpendicular to the edge of the main pattern 1, and the first and second fine auxiliary patterns and the main pattern do not contact one another. In addition, the first and second fine auxiliary patterns are arranged in the outside of the main pattern when the edge of the main pattern has an angle of 45 to 135 degrees, and the first and second fine auxiliary patterns are arranged in the inside of the main pattern when the edge of the main pattern has an angle other than an angle of 45 to 135 degrees.

FIG. 4b shows overlapped contour images having a light intensity distribution depending on amount of exposure energy of light passing through the mask. A light intensity distribution 3a of optimal exposure and a light intensity distribution 3b of lack exposure have a patterning effect in the vicinity of the edge (with an angle of 90 degrees) of the main pattern 1, as indicated by reference numeral E. Particularly, because there occurs little problem of contact alignment for an edge C' with an angle of 270 degrees, the fine auxiliary patterns may not be separately arranged.

According to the example method for forming the pattern as described above, because the fine auxiliary patterns do not contact each other with a particular angle, an undesired composed afterimage of the fine auxiliary patterns is not formed on a resist film of the semiconductor substrate when an exposure process is performed.

FIG. 4c shows a continuous distribution of light intensity in the vicinity of the edge of the main pattern when the mask is exposed. In the figure, a region with a dark color represents a portion showing weak light intensity and a region with a light color represents a portion showing strong light intensity. Reference numeral 20c denotes a pattern formed by an optimal exposure. Here, the optimal exposure refers to energy conditions that an exposure apparatus emits light such that a pattern has the same line width as the original mask shown in FIG. 1a.

As is apparent from the above description, with the configuration as above, by selectively dividing the fine auxiliary patterns such that they have an angle of 45 degrees in the vicinity of the edge of the main pattern, a margin of the edge of the main pattern at which a contact hole is formed can be easily secured.

In addition, because a plurality of fine auxiliary patterns and the main pattern formed in the vicinity of the edge of the main pattern do not contact one another, any malfunction, which may be caused by the fine auxiliary patterns, can be prevented, and resolution of the edge of the main pattern can be enhanced. Furthermore, a particle contamination source due to an irregular pattern, which may occur when an etching process is performed, can be prevented and the yield of devices can be enhanced.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. A method for forming a mask pattern of a semiconductor device, comprising:
    arranging a main pattern;
    arranging at least three first fine auxiliary patterns in the vicinity of the main pattern, wherein the first fine auxiliary patterns have a line width of 0.03 to 0.12 µm and oblique sides of the first fine auxiliary patterns are perpendicular to an edge of the main pattern;
    arranging at least three second fine auxiliary patterns in the vicinity of edges of the main pattern, the second fine auxiliary patterns having a predetermined tilt angle with respect to the first fine auxiliary patterns, oblique sides that are perpendicular to an edge of the main pattern and an oblique side that is substantially perpendicular to an edge of the first fine auxiliary patterns, and a line width of 0.03 to 0.12 µm, arranged such that the second fine auxiliary patterns are isolated from the first fine auxiliary patterns by a distance of more than 0.02 µm; and
    a third fine auxiliary pattern having a tilt angle of about 45 degrees with respect to the first fine auxiliary patterns.

2. The method of claim 1, wherein the first fine auxiliary patterns and the second fine auxiliary patterns and the main pattern do not contact one another.

3. The method of claim 1, wherein the first fine auxiliary patterns and the second fine auxiliary patterns are arranged in the outside of the main pattern when the edge of the main pattern has an angle of 45 to 135 degrees, and the first fine auxiliary patterns and the second fine auxiliary patterns are arranged in the inside of the main pattern when the edge of the main pattern has an angle other than an angle of 45 to 135 degrees.

* * * * *